United States Patent
Han et al.

(10) Patent No.: US 8,988,242 B2
(45) Date of Patent: Mar. 24, 2015

(54) FLAT PANEL DISPLAY DEVICE AND METHOD FOR MANUFACTURING THEREOF

(75) Inventors: Ho-Seok Han, Yongin (KR);
Jae-Myung Jang, Yongin (KR);
Jeong-Geun Yoo, Yongin (KR);
Sang-Hoon Shin, Yongin (KR)

(73) Assignee: Samsung Display Co., Ltd. (KR)

( * ) Notice: Subject to any disclaimer, the term of this patent is extended or adjusted under 35 U.S.C. 154(b) by 969 days.

(21) Appl. No.: 13/034,612

(22) Filed: Feb. 24, 2011

(65) Prior Publication Data

US 2011/0234646 A1    Sep. 29, 2011

(30) Foreign Application Priority Data

Mar. 24, 2010    (KR) .................. 10-2010-0026262

(51) Int. Cl.
*G08B 21/00*    (2006.01)
*G09G 3/32*    (2006.01)
*H01L 27/32*    (2006.01)

(52) U.S. Cl.
CPC .......... *G09G 3/3208* (2013.01); *H01L 27/3265* (2013.01); *G09G 2300/0452* (2013.01); *G09G 2300/0465* (2013.01); *G09G 2320/0233* (2013.01); *H01L 27/3213* (2013.01)
USPC ...................................................... 340/690

(58) Field of Classification Search
None
See application file for complete search history.

(56) References Cited

U.S. PATENT DOCUMENTS

| | | | |
|---|---|---|---|
| 2002/0186214 A1* | 12/2002 | Siwinski | 345/212 |
| 2005/0068477 A1 | 3/2005 | Shin et al. | |
| 2006/0119556 A1 | 6/2006 | Winters et al. | |
| 2006/0152531 A1 | 7/2006 | Lin et al. | |
| 2007/0001996 A1 | 1/2007 | Heo | |
| 2007/0063192 A1* | 3/2007 | Peng | 257/40 |
| 2007/0236621 A1* | 10/2007 | Tsai et al. | 349/38 |
| 2008/0049274 A1 | 2/2008 | Subbotin | |

FOREIGN PATENT DOCUMENTS

| | | |
|---|---|---|
| CN | 1437179 | 8/2003 |
| CN | 1601361 | 3/2005 |
| JP | 06051348 | 2/1994 |
| KR | 101067555 | * 9/2005 |

(Continued)

OTHER PUBLICATIONS

European Search Report dated Jul. 6, 2011 in corresponding European Application No. EP 11 159 587.2, claiming priority to Korean priority application No. 10-2010-0026262.

(Continued)

*Primary Examiner* — Grant Sitta
*Assistant Examiner* — Kirk Hermann
(74) *Attorney, Agent, or Firm* — Knobbe Martens Olson & Bear LLP

(57) ABSTRACT

A flat panel display device and a method of manufacturing the same are disclosed. The flat panel display device includes: a pixel unit including a plurality of scan lines, a plurality of data lines intersecting with the plurality of scan lines, and a plurality of pixels connected to the plurality of the scan lines and the plurality of the data lines, the plurality of pixels comprising red, green, blue and white pixels, a data driver outputting a data signal to the data lines, and a scan driver outputting a scan signal to the scan lines, where a storage capacitor of the blue pixel is formed in a lower portion of the white pixel.

15 Claims, 5 Drawing Sheets

(56) References Cited

FOREIGN PATENT DOCUMENTS

| | | |
|---|---|---|
| KR | 100583128 | 12/2005 |
| KR | 1020060129692 A | 12/2006 |

OTHER PUBLICATIONS

Office Action dated Jun. 1, 2011 in Korean priority Patent Application No. 10-2010-0026262, as submitted in IDS dated Jul. 25, 2011.

Office Action dated Nov. 5, 2013 in corresponding Chinese Patent Application No. 201110065549.5, as submitted in IDS dated Jan. 7, 2014.

Decision to Grant dated Jan. 4, 2012 in Korean priority application No. 10-2010-0026262, as submitted in IDS dated Jan. 27, 2012.

Office Action dated May 2, 2013 in corresponding Chinese Patent Application No. 201110065549.5, as submitted in IDS dated Jun. 27, 2013.

* cited by examiner

FLAT PANEL DISPLAY DEVICE AND METHOD FOR MANUFACTURING THEREOF

CROSS-REFERENCE TO RELATED APPLICATIONS

This application claims priority to and the benefit of Korean Patent Application No. 10-2010-0026262, filed on Mar. 24, 2010, in the Korean Intellectual Property Office, the entire content of which is incorporated herein by reference.

BACKGROUND

1. Field

The disclosure relates to a flat panel display device that adjusts chromaticity coordinates and a method for manufacturing thereof.

2. Description of the Related Technology

Flat panel display devices, which have a decreased weight and volume of a cathode ray tube, have been developing. Examples of flat panel display devices include a liquid crystal display, a field emission display, a plasma display panel, an organic light emitting display, and the like.

Flat panel display devices can be divided into passive matrix and active matrix types. Active matrix flat panel display devices generally have a better ability to implement video and resolution than the passive matrix type devices.

Active flat panel display devices include a thin film transistor for transporting a signal and a storage capacitor for maintaining a signal.

The aperture ratio of a pixel may be decreased due to the storage capacitor. As the aperture ratio decreases, a blue pixel would have a lower luminance than those of other color pixels, because the blue pixel generally has a low luminance as compared with other color pixels.

In order to increase the luminance of the pixels, a white pixel may be included in addition to the red, green, and blue pixels. However, the white expressed by the colors of the red, green, and blue pixels may not exactly match with the white expressed by the white pixel.

SUMMARY OF CERTAIN INVENTIVE ASPECTS

Embodiments of a flat panel display device and a method for manufacturing thereof, provide a device in which the luminance is not decreased and the white balance is adjusted.

One aspect is a flat panel display device including: a pixel unit including a plurality of scan lines, a plurality of data lines intersecting with the plurality of scan lines, and a plurality of pixels connected to the plurality of the scan lines and the plurality of the data lines, the plurality of pixels including red, green, blue and white pixels, a data driver outputting a data signal to the data lines, and a scan driver outputting a scan signal to the scan lines, where a storage capacitor of the blue pixel is formed in a lower portion of the white pixel.

The red pixel, the green pixel, the blue pixel, and the white pixel may be sequentially arranged along the scan lines.

Pixels of two different colors may be alternately arranged along the data lines.

In at least part of the display device, four pixels of different colors may be arranged in a first order, the first order repeated along one of the plurality of scan lines, and the four pixels of different colors may be arranged in a second order and repeated along the next scan line, where the first order includes pixels of a first, second, third and fourth color, and where the second order includes pixels of the third, fourth, first and second color.

An aperture ratio of the white pixel may be smaller than aperture ratios of the red, the green, and the blue pixels.

Another aspect is a method of manufacturing a flat panel display device including a plurality of scan lines, a plurality of data lines, and a plurality of red, green, blue, and white pixels, each of which formed in a pixel region, the plurality of the scan lines intersecting the plurality of the data lines, the method including: forming a gate electrode for each of the red, the green, the blue, and the white pixels, forming a first electrode of a storage capacitor for each of the red, green, blue and white pixels, where the first electrode of the storage capacitor of the blue pixel is formed in the pixel region of the white pixel, forming an insulating layer over the first electrodes of the storage capacitors and the gate electrodes of the red, green, blue and white pixels, forming a source electrode and a drain electrode for each of the red, green, blue and white pixels, and forming a second electrode of the storage capacitor for each of the red, green, blue and white pixels.

In the plurality of the pixels, the red pixel, the green pixel, the blue pixel, and the white pixel may be sequentially arranged in the extensional direction of the scan line, and pixels of two different colors may be alternately arranged in the extensional direction of the data lines.

In at least part of the display device, four pixels of different colors may be arranged in a first order, the first order repeated along one of the plurality of scan lines, and the four pixels of different colors may be arranged in a second order and repeated along the next scan line, where the first order includes pixels of a first, second, third and fourth color, and where the second order includes pixels of the third, fourth, first and second color.

An aperture ratio of the white pixel may be smaller than aperture ratios of the red, the green, and the blue pixels.

Another aspect is a flat panel display device configured to display an image on a display surface, the device including: a display area including a plurality of pixels, a plurality of data lines and a plurality of scan lines, where each pixel occupies a pixel area defined between two neighboring data lines and between two neighboring scan lines when viewed from the top in a direction perpendicular to the display surface of the flat panel display device, where each pixel includes a storage capacitor used for operation of the pixel, and where when viewed in the direction, the storage capacitor of at least one of the plurality of pixels is located at least partially in the pixel area of a neighboring pixel of the at least one pixel whereas when viewed in the direction, the storage capacitor of each of the other pixels does not extend to the pixel area of a neighboring pixel of each of the other pixels.

The storage capacitor of the at least one of the plurality of pixels may be located entirely in the pixel area of the neighboring pixel of the at least one pixel.

When viewed in the direction, the storage capacitor of each of the other pixels may be located substantially entirely inside the pixel area of each of the other pixels.

When viewed in the direction, the storage capacitor of each of the other pixels may be located entirely inside the pixel area of each of the other pixels.

An aperture ratio of the at least one of the plurality of pixels may be larger than aperture ratios of the other pixels.

The plurality of pixels may include a red pixel, a green pixel, a blue pixel and a white pixel.

The storage capacitor of the blue pixel may be located at least partially outside the pixel area of the blue pixel.

The storage capacitor of the blue pixel may be located at least partially inside the pixel area of the white pixel.

The red, green, blue and white pixels may be arranged in order along the scan lines and pixels of two different colors may be alternately arranged along the data lines.

An aperture ratio of the blue pixel may be larger than aperture ratios of the red, green and white pixels.

An aperture ratio of the white pixel may be smaller than aperture ratios of the red, green and blue pixels.

According to the flat panel display device and the method thereof of the present invention, a white chromaticity coordinate generated by the red, green, and blue pixels may be matched with the white chromaticity coordinate generated by the white pixel by decreasing the aperture ratio of the white pixel and increasing the aperture ratio of the blue pixel.

BRIEF DESCRIPTION OF THE DRAWINGS

The accompanying drawings, together with the specification illustrate exemplary embodiments of the present invention.

DETAILED DESCRIPTION OF CERTAIN INVENTIVE EMBODIMENTS

Figure 1:
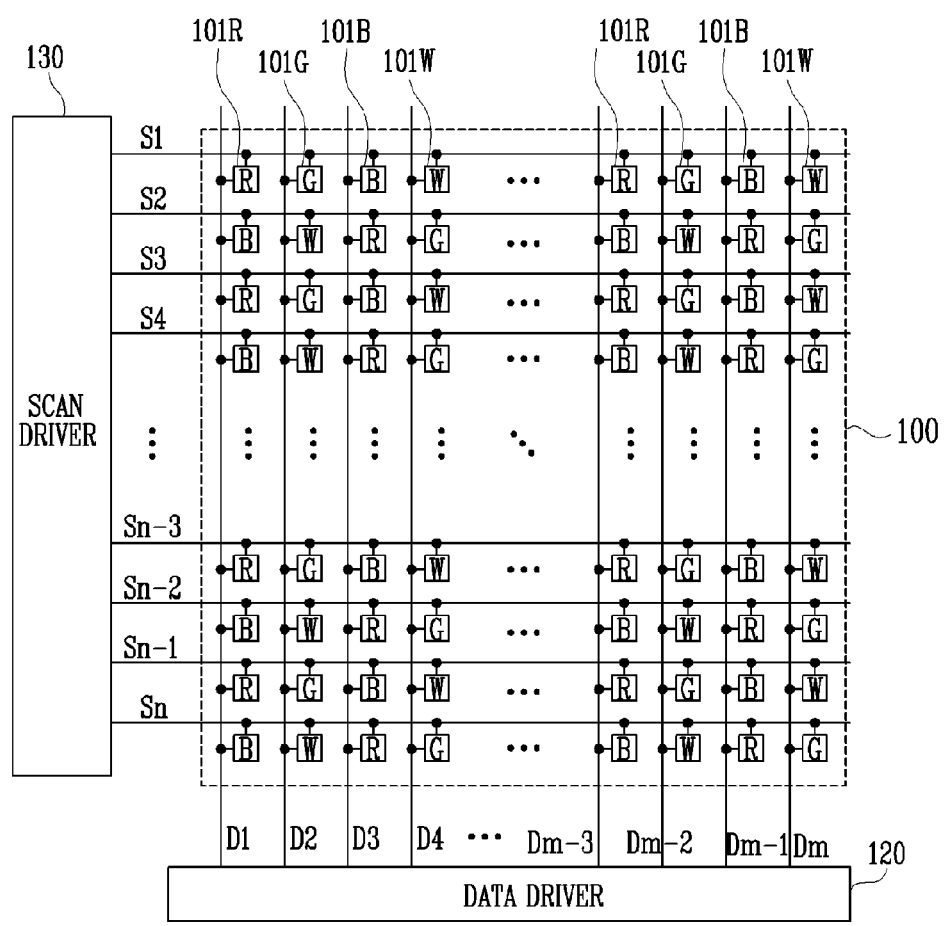
FIG. 1 shows the structure of an embodiment of a flat panel display device.

In the following detailed description, only certain exemplary embodiments of the present invention have been shown and described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, when an element is referred to as being "on" another element, it can be directly on another element or be indirectly on another element with one or more intervening elements interposed there between. Also, when an element is referred to as being "connected to" another element, it can be directly connected to another element or be indirectly connected to another element with one or more intervening elements interposed there between. Hereinafter, like reference numerals generally refer to like elements.

FIG. 1 shows the structure of an embodiment of a flat panel display device. With reference to FIG. 1, the flat panel display device includes the pixel unit 100, the data driver 120 and the scan driver 130.

In the pixel unit 100, a plurality of pixels 101R (red), 101G (green), 101B (blue), 101W (white) are formed on the regions of intersections between the data lines D1, D2, . . . Dm−1, Dm and the scan lines S1, S2, . . . Sn−1, Sn. The plurality of pixels 101R, 101G, 101B, 101W comprise transistors and pixel electrodes connected to the transistors. The pixels may be arranged in a layout of red, green, blue and white in a first row, and in a layout of blue, white, red and green in the next row. The layouts of the first and second rows may then be repeated. In one embodiment, the blue pixel 101B may be arranged to have the biggest aperture ratio, and the white pixel 101W may be arranged to have the smallest aperture ratio relative to the aperture ratios of all pixels. The aperture ratio of the red pixel 101R may be arranged to be the same as that of the green pixel 101G.

The data driver 120 generates a data signal by using an image signal. The data driver 120 supplies this generated signal to the pixel unit 100 by connecting to the data lines D1, D2, . . . Dm−1, Dm of the pixel unit 100.

The scan driver 130 generates a scan signal, and supplies the scan signal to columns of the pixel unit 100 by connecting to the scan lines S1, S2, . . . Sn−1, Sn. The data signal generated by the data driver 120 may by supplied to a pixel 101 to which the scan signal is supplied, so that the voltage of the data signal may be supplied to that pixel 101.

Figure 2:
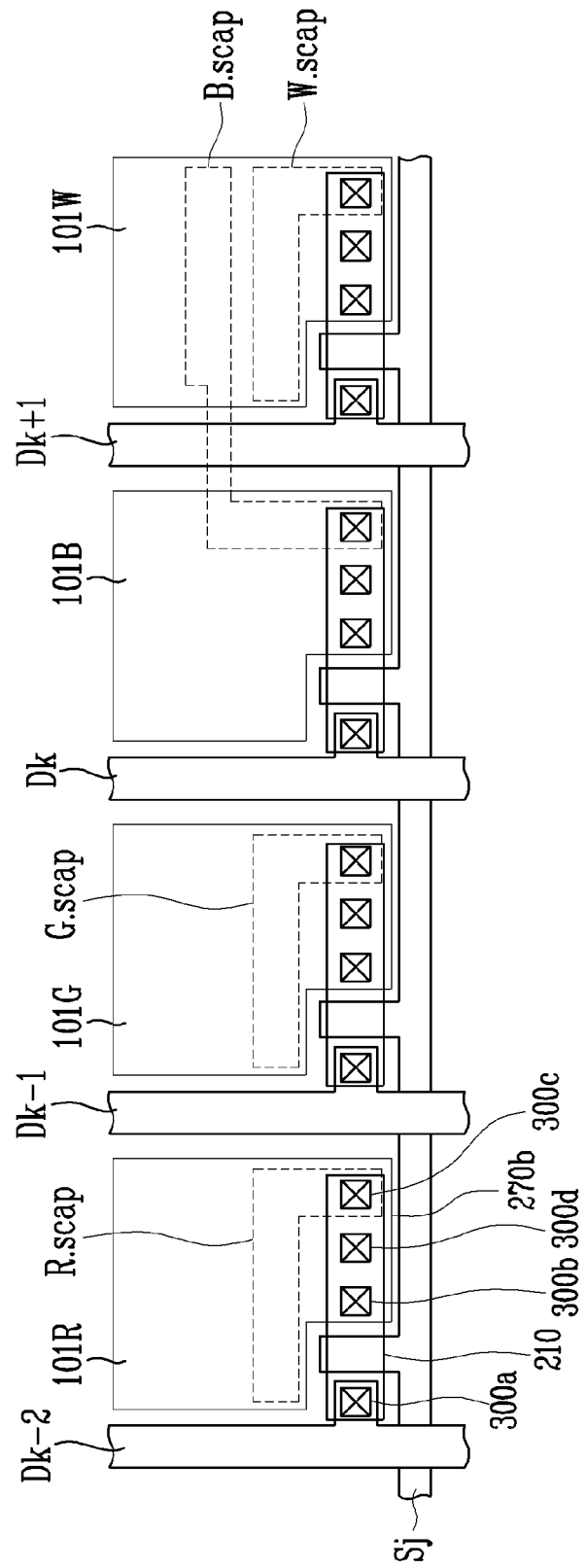
FIG. 2 is a plane view showing the structure of a pixel included in the pixel region of an embodiment of the flat panel display device.

FIG. 2 is a plane view showing the structure of a pixel included in an embodiment of a pixel unit. With reference to FIG. 2, the pixel unit 100 is arranged with the red pixel 101R, the green pixel 101G, the blue pixel 101B, and the white pixel 101W in the regions of the intersections between each data line Dk−2, Dk−1, Dk+1 and scan line Sj.

Each pixel includes a storage capacitor for maintaining the data signal. In one embodiment, the storage capacitors R.scap of the red pixel and G.scap of the green pixel are respectively formed in the red pixel 101R and the green pixel 101G. The storage capacitor B.scap of the blue pixel 101B is formed in the white pixel (101W). The storage capacitor W.scap of the white pixel (101W) is also formed in the white pixel 101W. The configuration of the storage capacitor B.scap helps to make the aperture ratio of the blue pixel 101B is larger than that of the green, red and white pixels and the aperture ratio of the white pixel 101W smaller than the blue, green and red pixels.

A gate in the transistor of the blue pixel 101B is electrically connected to the storage capacitor B.scap of the blue pixel 101B formed in the white pixel by extending to the gate in the transistor of the white pixel 101W.

Figure 3:
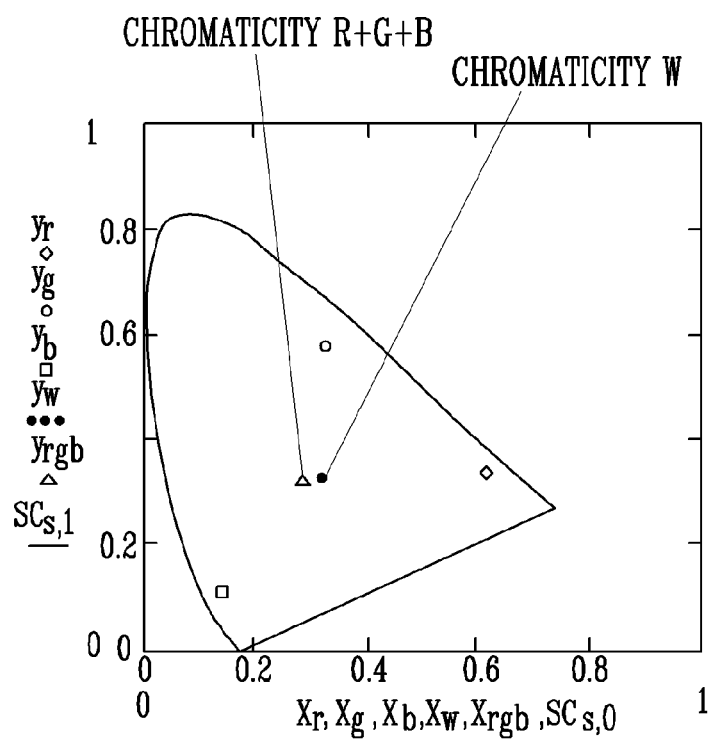
FIG. 3 is a graph showing the chromaticity coordinates of an embodiment of the flat panel display device.

FIG. 3 is a graph showing the chromaticity coordinates of an embodiment of the flat panel display device. With reference to FIG. 3, the embodiment of the flat panel display device shown in FIG. 2 expresses white color in two ways: by controlling the luminances of the red pixel, the green pixel and the blue pixel, and also by controlling the luminance of the white pixel.

As illustrated in FIG. 3, a comparison of the white color displayed by the two ways shows that the chromaticity coordinates of the two white colors may not be matched.

This difference in chromaticity coordinates may be minimized by decreasing the aperture ratio of the white pixel.

Since the storage capacitor of the blue pixel B.scap is formed in the white pixel, the aperture ratio of the white pixel will be decreased, and the aperture ratio of the blue pixel will be increased. Therefore, the overall luminance will not be decreased because the luminance of the white pixel may be decreased, but the luminance of the blue pixel may be increased.

The equalization of the white colors can be achieved by matching the chromaticity coordinates of the white color expressed by the white pixel with the chromaticity coordinates of the white color expressed by the red, green and blue pixels.

FIG. 4A to FIG. 4F is cross-sectional views for illustrating an embodiment of a method for manufacturing the embodiment of a flat panel display device shown in FIG. 2.

Figure 4A:
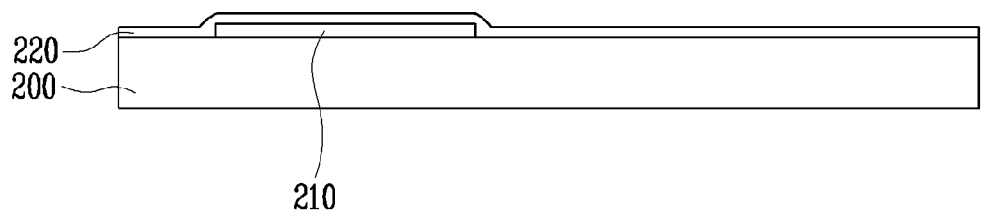
FIG. 4A to FIG. 4F are cross-sectional views for illustrating an embodiment of a method for manufacturing an embodiment of the flat panel display device.
Figure 4B:
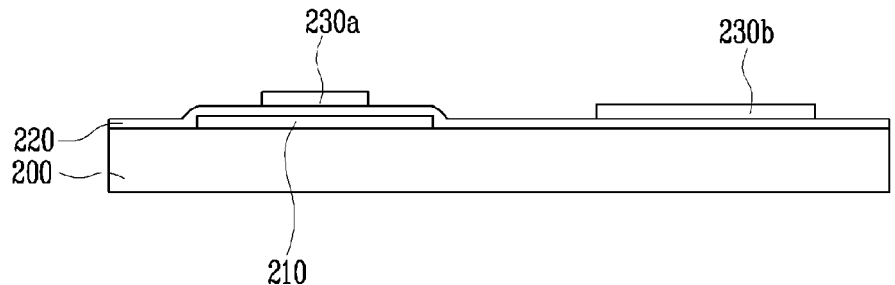

As shown in FIG. 4A, an active layer 210 is formed on the substrate 200, and a first insulating layer 220 is formed on the active layer 210. As shown in FIG. 4B, a first conductive layer (now shown) is formed on a first insulating layer 220, and patterned, so that a gate electrode 230a is formed over the active layer 210, and a first electrode 230b of the storage capacitor is formed over the substrate 200. By using a first conductive layer, a scan line may be formed and connected to the gate electrode 230a.

The gate electrode 230a and wiring are formed on the first conductive layer formed in the blue pixel 101B. The gate electrode 230a, the first electrode 230b of the storage capacitor of the blue pixel 101B, and the first electrode 230b of the storage capacitor of the white pixel 101W are all formed in the first conductive layer formed in the white pixel 101W. The wiring formed in the blue pixel 101B may be connected to the first electrode 230b of the storage capacitor of the blue pixel 101B formed in the white pixel 101W.

Figure 4C:
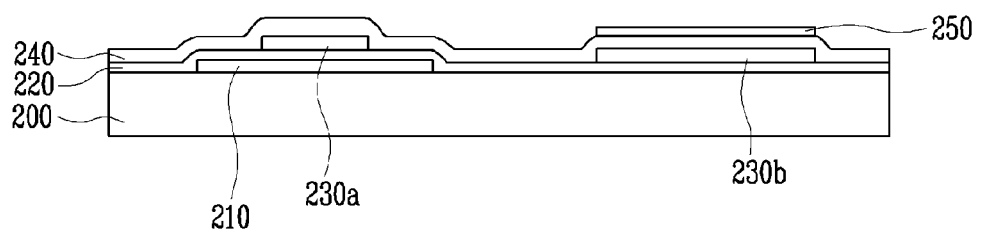
Figure 4D:
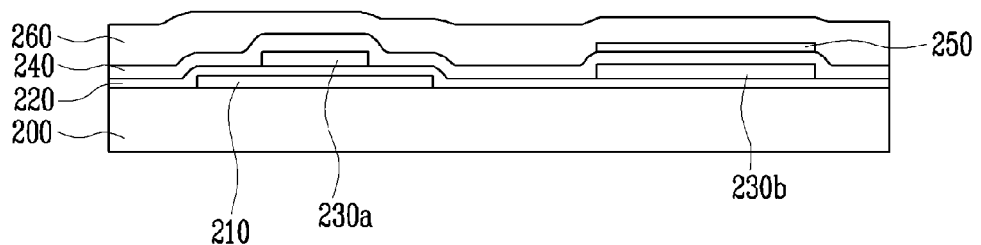

As shown in FIG. 4C, a second insulating layer 240 is formed over gate electrode 230a and first electrode 230b. A second electrode 250 of the storage capacitor is formed above the first electrode 230b of the storage capacitor. The second electrode 250 of the storage capacitor of the blue pixel 101B is formed in the region of the white pixel 101W. As shown in FIG. 4D a third insulating layer 260 is formed above the second electrode 250.

Figure 4E:
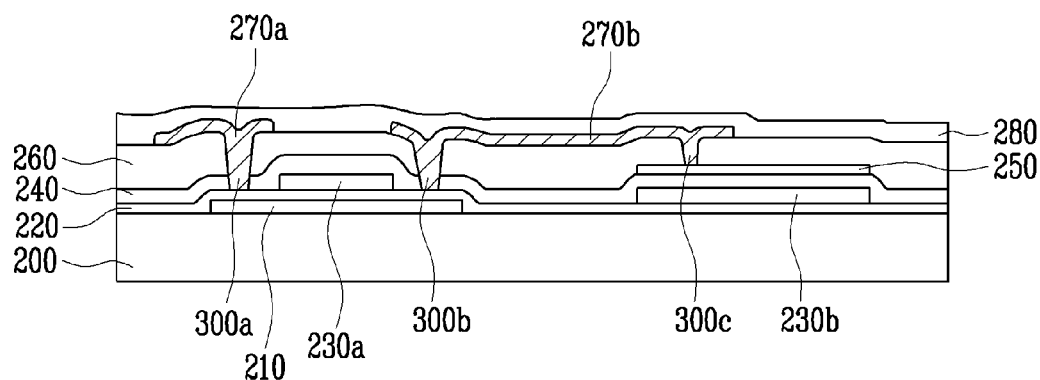

As shown in FIG. 4E, first 300a, second 300b and third 300c contact holes are formed, and source and drain regions 270a and 270b formed are electrically contacted with the active layer 210 and the second electrode 250 of the storage capacitor through the first 300a, second 300b and third 300c contact holes. A fourth insulating layer 280 is formed above the source and drain regions.

The source and drain regions 270a and 270b connected with the active layer 210 through the first and second contact holes 300a and 300b are connected with the source electrodes of the thin film transistor. The source and drain regions 270a and 270b connected with the second electrode 250 of the storage capacitor through the third contact hole 300c are connected with the drain electrode of the thin film transistor, thereby allowing delivery of the signal delivered through the transistor to the storage capacitor.

Figure 4F:
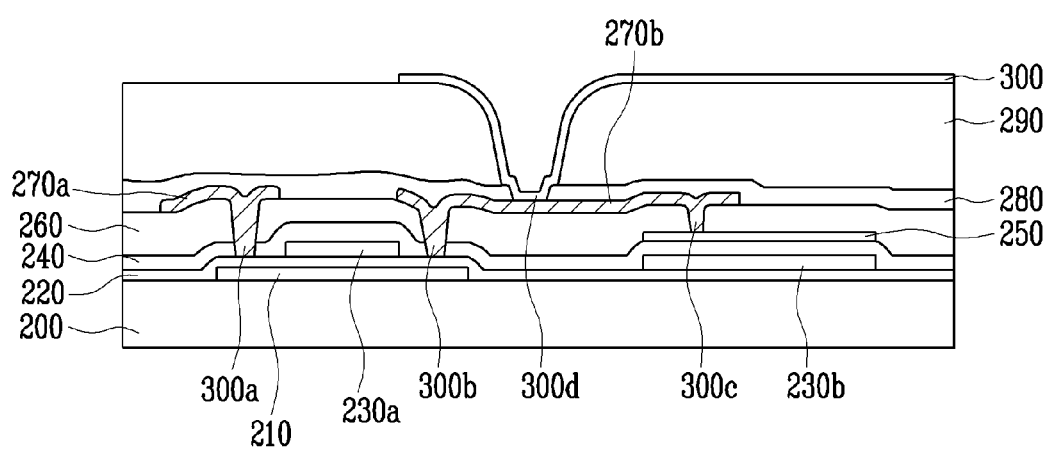

As shown in FIG. 4F, a fourth contact hole 300d, a planarization layer 290 and a pixel electrode 300 are formed. The source and drain regions 270a and 270b connected with the pixel electrode 300 through the fourth contact hold 300d, and the pixel electrode 300 thus receives the signal through the thin film transistor.

While certain embodiments of the present invention have been described, it is to be understood that the invention is not limited to the described embodiments, but, on the contrary, is intended to cover various modification and equivalent arrangements.

What is claimed is:

1. A flat panel display device comprising:
a pixel unit comprising a plurality of scan lines, a plurality of data lines intersecting with the plurality of scan lines, and a plurality of pixels connected to the plurality of the scan lines and the plurality of the data lines, the plurality of pixels comprising red, green, blue and white pixels;
a data driver outputting a data signal to the data lines; and
a scan driver outputting a scan signal to the scan lines,
wherein a storage capacitor of the blue pixel is formed in a lower portion of the white pixel and wherein the storage capacitor is formed to extend on both sides of a data line arranged between the blue and the white pixel.

2. The flat panel display device of claim 1, wherein the red pixel, the green pixel, the blue pixel, and the white pixel are sequentially arranged along the scan lines.

3. The flat panel display device of claim 1, wherein pixels of two different colors are alternately arranged along the data lines.

4. The flat panel display device of claim 1, wherein in at least part of the display device, four pixels of different colors are arranged in a first order, the first order repeated along one of the plurality of scan lines, and the four pixels of different colors are arranged in a second order and repeated along the next scan line, wherein the first order comprises pixels of a first, second, third and fourth color, and wherein the second order comprises pixels of the third, fourth, first and second color.

5. The flat panel display device of claim 1, wherein an aperture ratio of the white pixel is smaller than aperture ratios of the red, the green, and the blue pixels.

6. A method of manufacturing a flat panel display device comprising a plurality of scan lines, a plurality of data lines, and a plurality of red, green, blue, and white pixels, each of which formed in a pixel region the plurality of the scan lines intersecting the plurality of the data lines, the method comprising:
forming a gate electrode for each of the red, the green, the blue, and the white pixels;
forming a first electrode of a storage capacitor for each of the red, green, blue and white pixels, wherein the first electrode of the storage capacitor of the blue pixel is formed in the pixel region of the white pixel, wherein the first electrode of the storage capacitor is formed to extend on both sides of a data line arranged between the blue and the white pixel;
forming an insulating layer over the first electrodes of the storage capacitors and the gate electrodes of the red, green, blue and white pixels;
forming a source electrode and a drain electrode for each of the red, green, blue and white pixels; and
forming a second electrode of the storage capacitor for each of the red, green, blue and white pixels.

7. The method of claim 6, wherein in at least part of the display device, four pixels of different colors are arranged in a first order, the first order repeated along one of the plurality of scan lines, and the four pixels of different colors are arranged in a second order and repeated along the next scan line, wherein the first order comprises pixels of a first, second, third and fourth color, and wherein the second order comprises pixels of the third, fourth, first and second color.

8. The method of claim 6, wherein an aperture ratio of the white pixel is smaller than aperture ratios of the red, the green, and the blue pixels.

9. A flat panel display device configured to display an image on a display surface, the device comprising:
a display area comprising a plurality of pixels, a plurality of data lines and a plurality of scan lines, wherein each pixel occupies a pixel area defined between two neighboring data lines and between two neighboring scan lines when viewed from the top in a direction perpendicular to the display surface of the flat panel display device wherein the plurality of pixels comprises a red pixel, a green pixel, a blue pixel and a white pixel;
wherein each pixel comprises a storage capacitor used for operation of the pixel; and
wherein when viewed in the direction, the storage capacitor of at least one of the plurality of pixels is located at least partially in the pixel area of a neighboring pixel of the at least one pixel whereas when viewed in the direction, wherein the storage capacitor is formed to extend on both sides of a data line arranged between the neighboring pixels, the storage capacitor of each of the other pixels does not extend to the pixel area of a neighboring pixel of each of the other pixels and wherein the storage capacitor of the blue pixel is located at least partially outside the pixel area of the blue pixel.

10. The device of claim 9, wherein the storage capacitor of the at least one of the plurality of pixels is located entirely in the pixel area of the neighboring pixel of the at least one pixel.

11. The device of claim 9, wherein when viewed in the direction, the storage capacitor of each of the other pixels is located entirely inside the pixel area of each of the other pixels.

12. The device of claim 9, wherein an aperture ratio of the at least one of the plurality of pixels is larger than aperture ratios of the other pixels.

13. The device of claim 9, wherein the storage capacitor of the blue pixel is located at least partially inside the pixel area of the white pixel.

14. The device of claim 9, wherein an aperture ratio of the blue pixel is larger than aperture ratios of the red, green and white pixels.

15. The device of claim 9, wherein an aperture ratio of the white pixel is smaller than aperture ratios of the red, green and blue pixels.

* * * * *